(12) United States Patent
Robinson et al.

(10) Patent No.: US 7,865,165 B2
(45) Date of Patent: Jan. 4, 2011

(54) SCALABLE RADIO RECEIVER ARCHITECTURE PROVIDING THREE-DIMENSIONAL PACKAGING OF MULTIPLE RECEIVERS

(75) Inventors: Parker Allen Robinson, Dunedln, FL (US); Michael Anthony Wyatt, Clearwater, FL (US); Perry Kevin Falk, Fort Wayne, IN (US); Edward Allen Hall, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 579 days.

(21) Appl. No.: 11/961,204

(22) Filed: Dec. 20, 2007

(65) Prior Publication Data

US 2009/0163161 A1 Jun. 25, 2009

(51) Int. Cl.
*H04B 1/28* (2006.01)
(52) U.S. Cl. .................. 455/333; 455/140; 257/679
(58) Field of Classification Search ............... 455/41.2, 455/140, 333; 257/679
See application file for complete search history.

(56) References Cited

U.S. PATENT DOCUMENTS

| | | | | |
|---|---|---|---|---|
| 7,373,143 | B2 * | 5/2008 | Dygert | 455/418 |
| 7,440,773 | B2 * | 10/2008 | Son | 455/556.2 |
| 7,463,865 | B2 * | 12/2008 | Reese et al. | 455/78 |
| 7,565,108 | B2 * | 7/2009 | Kotola et al. | 455/41.2 |
| 2005/0181749 | A1 * | 8/2005 | Lee | 455/126 |
| 2005/0272400 | A1 | 12/2005 | Chen et al. | |
| 2007/0096160 | A1 | 5/2007 | Beroz et al. | |
| 2008/0151126 | A1 * | 6/2008 | Yu | 348/734 |

FOREIGN PATENT DOCUMENTS

WO WO2007/044368 4/2007
WO WO2007/130471 11/2007

OTHER PUBLICATIONS

European Search Report, EP Application No. EP 08 02 1330, Aug. 13, 2009.

\* cited by examiner

*Primary Examiner*—Nhan Le
(74) *Attorney, Agent, or Firm*—RatnerPrestia

(57) ABSTRACT

Methods of forming scalable systems and scalable systems on an integrated circuit (SoC) are provided. First and second radio frequency (RF) systems are disposed on first and second substrates, respectively. A first processor that is configured to process the first RF system is disposed on a substrate separate from the first substrate and a second processor that is configured to process the second RF system is disposed on a substrate separate from the second substrate. The first processor and the first RF system are stacked one on top of the other to configure a first RFSoC and the second processor and the second RF system are stacked one on top of the other to configure a second RFSoC. The first and second RFSoCs are disposed either in a horizontal plane, laterally spaced from each other, or in vertically stacked planes, one above the other.

23 Claims, 13 Drawing Sheets

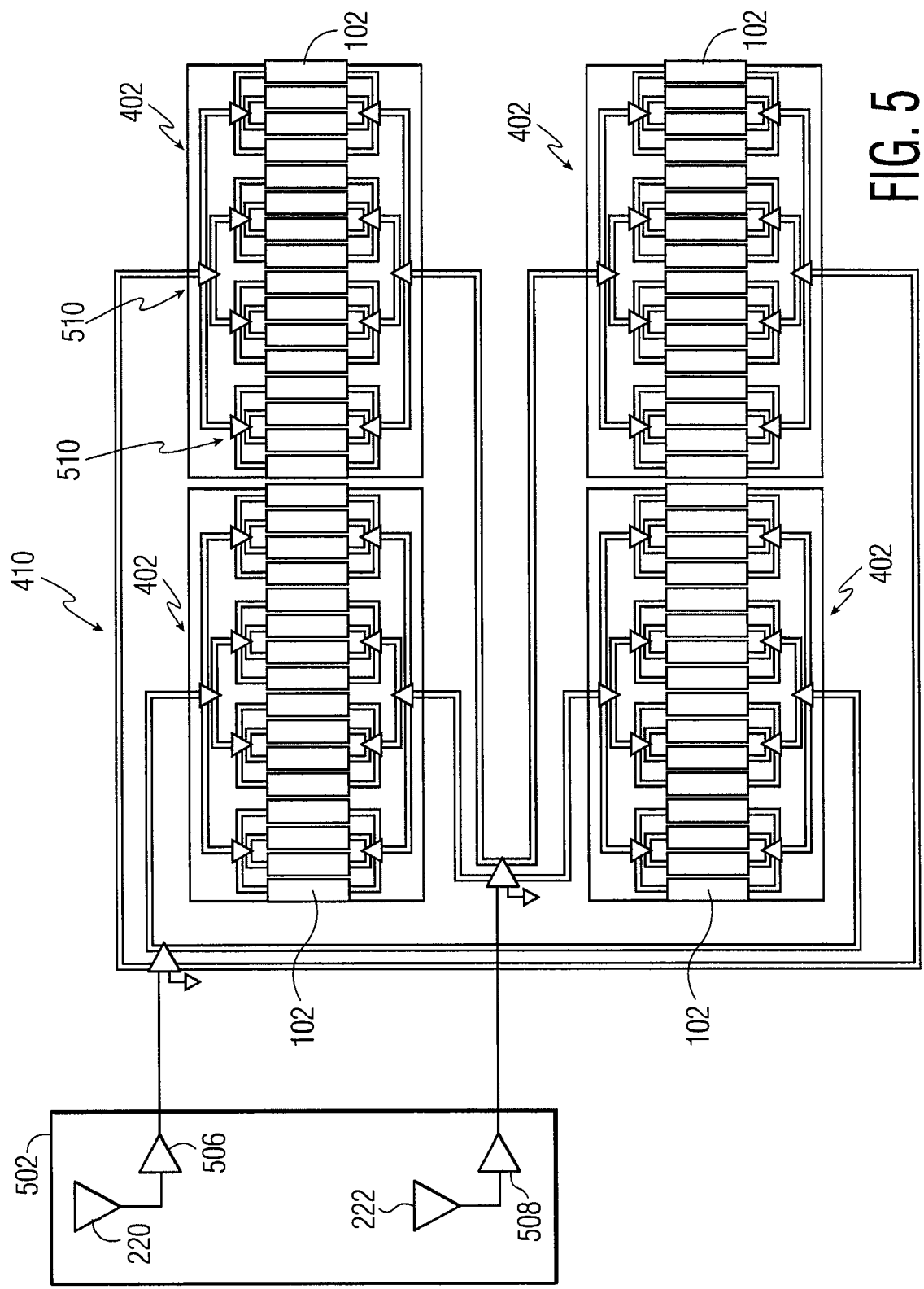

US 7,865,165 B2

SCALABLE RADIO RECEIVER ARCHITECTURE PROVIDING THREE-DIMENSIONAL PACKAGING OF MULTIPLE RECEIVERS

TECHNICAL FIELD

The present invention relates, in general, to communication systems. More specifically, it relates to scalable receiver systems on an integrated circuit.

BACKGROUND OF THE INVENTION

In modern communication systems, a signal of interest typically modulates a carrier frequency at a transmitter and transmitted as a radio frequency (RF) signal by an antenna. A receiver typically converts the received RF signal into a baseband signal. The baseband signal may then be demodulated by a processor in order to obtain the signal of interest.

A number of individual receivers may be combined into a receiver system. Each individual receiver may be associated with a different frequency range and each demodulated signal may provide a different signal of interest. There is a general trend toward reducing the size of receivers to form a smaller system.

SUMMARY OF THE INVENTION

The present invention is embodied in methods of forming a scalable system and a scalable system on an integrated circuit system on chip (SoC). A first radio frequency (RF) system is disposed on a first substrate and a second RF system is disposed on a second substrate. A first processor, configured to process the first RF system, is disposed on a substrate separate from the first substrate. A second processor, configured to process the second RF system, is disposed on a substrate separate from the second substrate. The first processor and the first RF system are stacked one on top of the other to configure a first RFSoC and the second processor and the second RF system are stacked one on top of the other to configure a second RFSoC. The first RFSoC and the second RFSoC are disposed either (a) in a horizontal plane, laterally spaced from each other, or (b) in vertically stacked planes, one above the other.

BRIEF DESCRIPTION OF THE DRAWINGS

The invention may be understood from the following detailed description when read in connection with the accompanying drawing. Included in the drawing are the following figures:

FIG. 5 is a block diagram of the multiple receiver system shown in FIG. 4B illustrating RF signal distribution from dual antennas to several receivers, in accordance with an embodiment of the present invention;

DETAILED DESCRIPTION OF THE INVENTION

Figure 1:
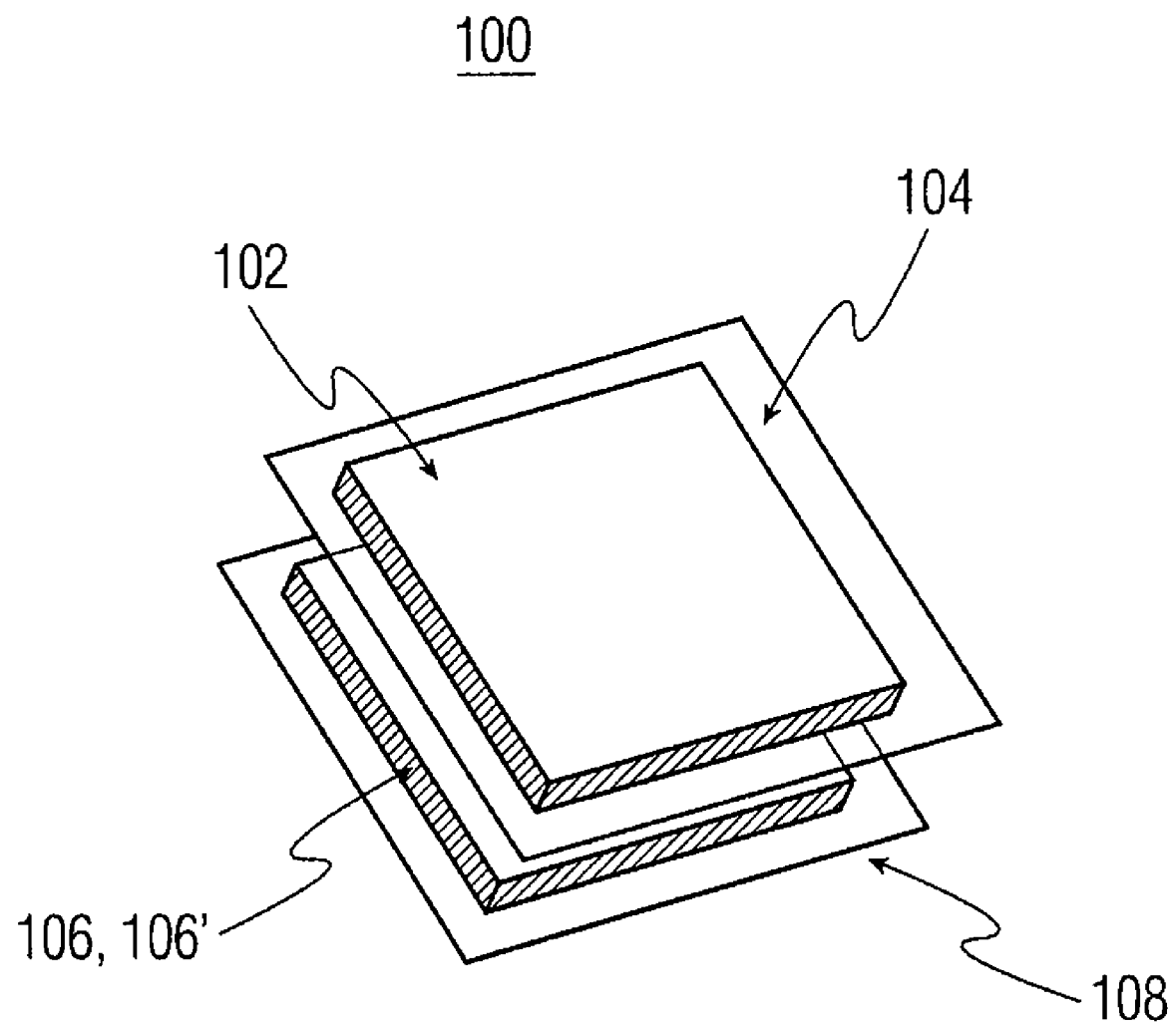
FIG. 1 is a perspective view of a scalable receiver system formed on an integrated circuit, in accordance with an embodiment of the present invention.

As will be explained by reference to FIG. 1, the present invention includes scalable receiver systems formed on an integrated circuit, each designated generally as 100. Scalable receiver system 100 includes RF system module 102 formed on silicon (Si) carrier 104 and processor module 106 formed on mechanical carrier 106, an example of which includes a ceramic carrier. The RF system module is disposed on top of the processor module. RF system module 102 and processor module 106 are described further below with respect to FIG. 2.

Figure 2:
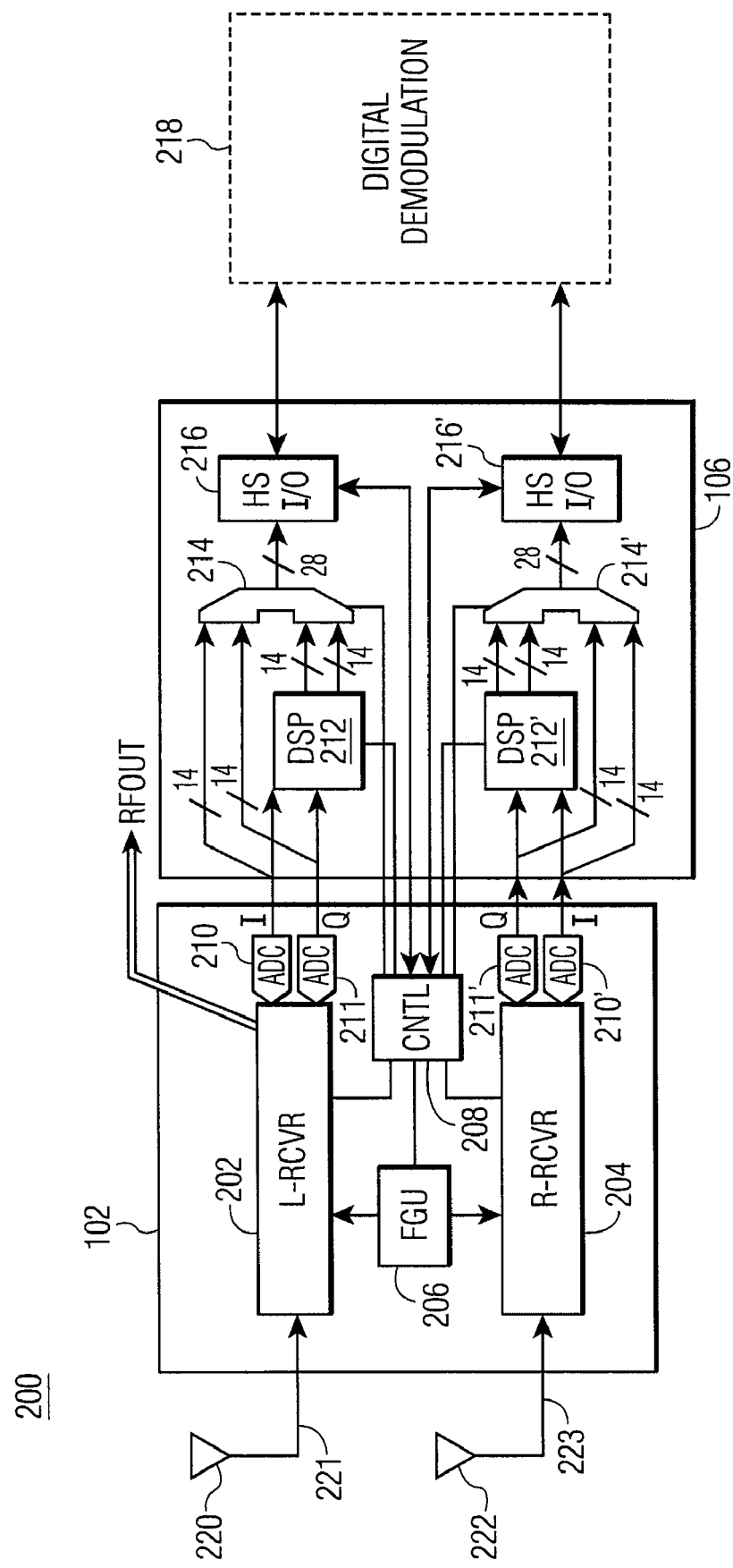
FIG. 2 is a block diagram of a dual channel receiver module of the scalable receiver system shown in FIG. 1, in accordance with an embodiment of the present invention.

Si carrier 104 may carry, for example, power signals, ground signals and digitized in-phase (I) and quadrature (Q) signals provided by RF system module 102 (FIG. 2). In addition, Si carrier 104 may carry control signals between RF system module 102 and processor module 106.

Depending upon the processing performed by RF system module 102, receiver system 100 may include slot 106' between Si carrier 104 and mechanical carrier 106, instead of processor module 106. For example, as shown in FIG. 2, an intermediate frequency (IF) signal, RFout, may be transmitted instead of digitized baseband I and Q signals. In this example, processing module 106 may not be necessary and may be replaced by slot 106'.

Referring next to FIG. 2, there is shown a block diagram of a receiver module, designated generally as 200, of scalable receiver system 100 (FIG. 1). RF signals 221, 223 from respective left and right antennas 220, 222 are provided to corresponding channels of RF system module 102 for down-conversion to baseband I and Q signals and digitization. The digitized baseband I and Q signals are provided to processor module 106 for further processing, such as digital channelization (described below with respect to FIG. 3A). The output signals from processor module 106 are provided as high speed (HS) data streams.

The RF signals 221, 223 in RF system module 102 are down-converted to baseband I and Q signals by respective left receiver (L-RCVR) and right receiver (R-RCVR) modules 202, 204 using frequency generation unit (FGU) 206 as a frequency synthesizer. As described below with respect to FIGS. 3A-3D, L/R-RCVR modules 202, 204 may also perform analog or digital channelization on the respective baseband I and Q signals. The baseband I and Q signals or, optionally, channelized I and Q signals are digitized by respective analog-to-digital converters (ADC) 210, 211, 210', 211'. Controller (CNTL) 208 provides control of the down-conversion and/or channelization functions of L/R-RCVR modules 202, 204.

Processor module 106 includes respective digital signal processors (DSP) 212,212' for processing the digitized I and Q signals from respective receivers of RF signal module 102. DSPs 212,212' are described further below with respect to FIGS. 3A-3D. In addition, processor module 106 includes multiplexers 214, 214' for receiving the digitized I and Q signals from respective receivers of RF signal module 102 and the processed I and Q signals from DSPs 212,212'. Multiplexers 214, 214' combine the processed I and Q signals (or the digitized I and Q signals) and provide the combined signals to respective HS input/output (I/O) port 216,216'.

CNTL 208 provides signals to control operation of DSP 212,212', multiplexer 214,214' and HS I/O port 216,216'. For example, CNTL 208 may control multiplexer 214,214' to combine digitized I and Q signals from RF system module 102 for transmission from HS I/O port 216,216'. It may be appreciated that CNTL 208, multiplexers 214,214' and DSP 212,212' provide flexibility in processing the digitized I and Q signals such that RF signal module 102 and/or processor module 106 perform processing on the received RF signals 221,223.

As shown in FIG. 2, 14 signal lines each representing digitized I and Q signals are provided to multiplexers 214, 214'. In addition, 14 signal lines each representing processed I and Q signals are provided to multiplexers 214, 214'. In this example, each multiplexer 214,214' provides 28 signal lines to respective HS I/O ports 216, 216'. It is understood that FIG. 2 is exemplary and that any suitable number of signal lines may be used to represent the digitized and processed I and Q signals.

Figure 4A:
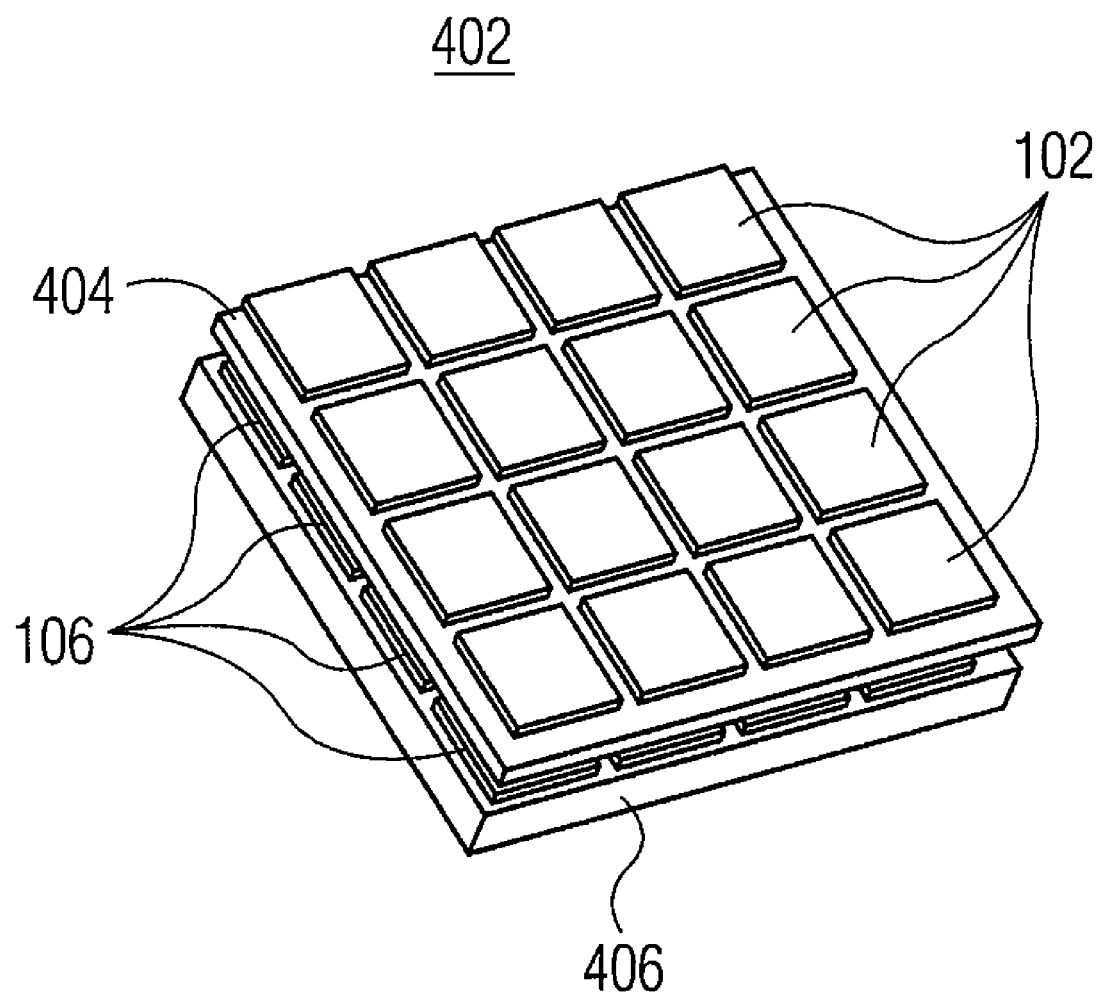
FIGS. 4A-4C are perspective views of multiple receiver systems formed from different arrangements of scalable receivers shown in FIG. 1, in accordance with embodiments of the present invention.
Figure 4B:
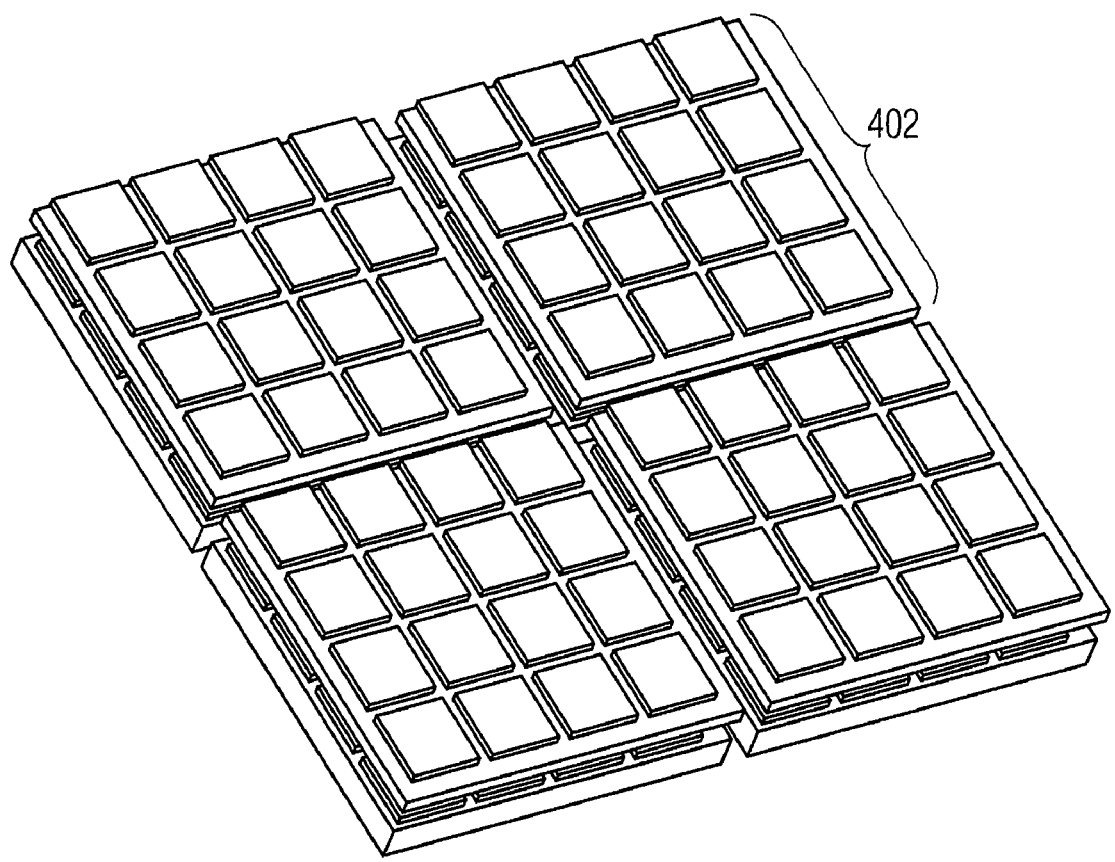
Figure 4C:
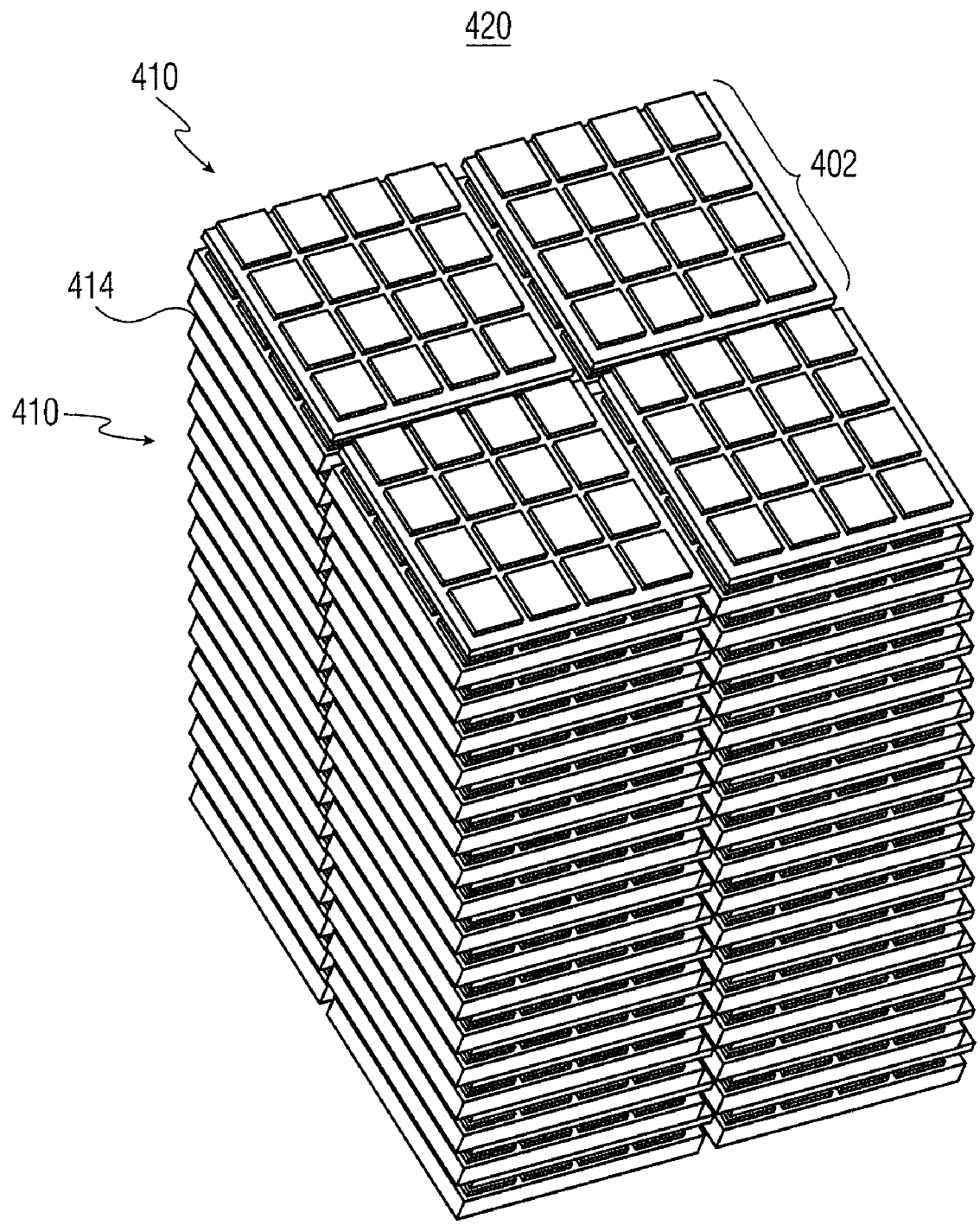

In an exemplary embodiment, HS I/O ports 216, 216' each include a 10 Gbit Ethernet port that provides digital data streams at 840 Mbps. As described below, a number of scalable receiver systems 100 may be combined into a multiple receiver system, such as shown in FIGS. 4A-4C. It is, thus, desirable that the speed of each digital data stream be sufficiently fast in order to process simultaneous digital data streams from all of the receivers, for example, for time difference of arrival (TDOA) processing. It is understood that any suitable I/O port may be used for generating a data stream of sufficient speed.

An output signal from processor module 106 may be provided to digital demodulator 218 to further demodulate received RF signals 221,223. Digital demodulator 218 may be a field programmable gate array (FPGA)-based demodulator or any other suitable demodulator.

It may be appreciated that receiver module 200 may receive and process one RF signal from one antenna, such as RF signal 221 from antenna 220. As one example, RF system module 102 may provide IF signal RFout based on RF signal 221. As another example, RF system module 102 may process RF signal 221 and provide digitized I and Q signals from ADC 210, 211.

Figure 3A:
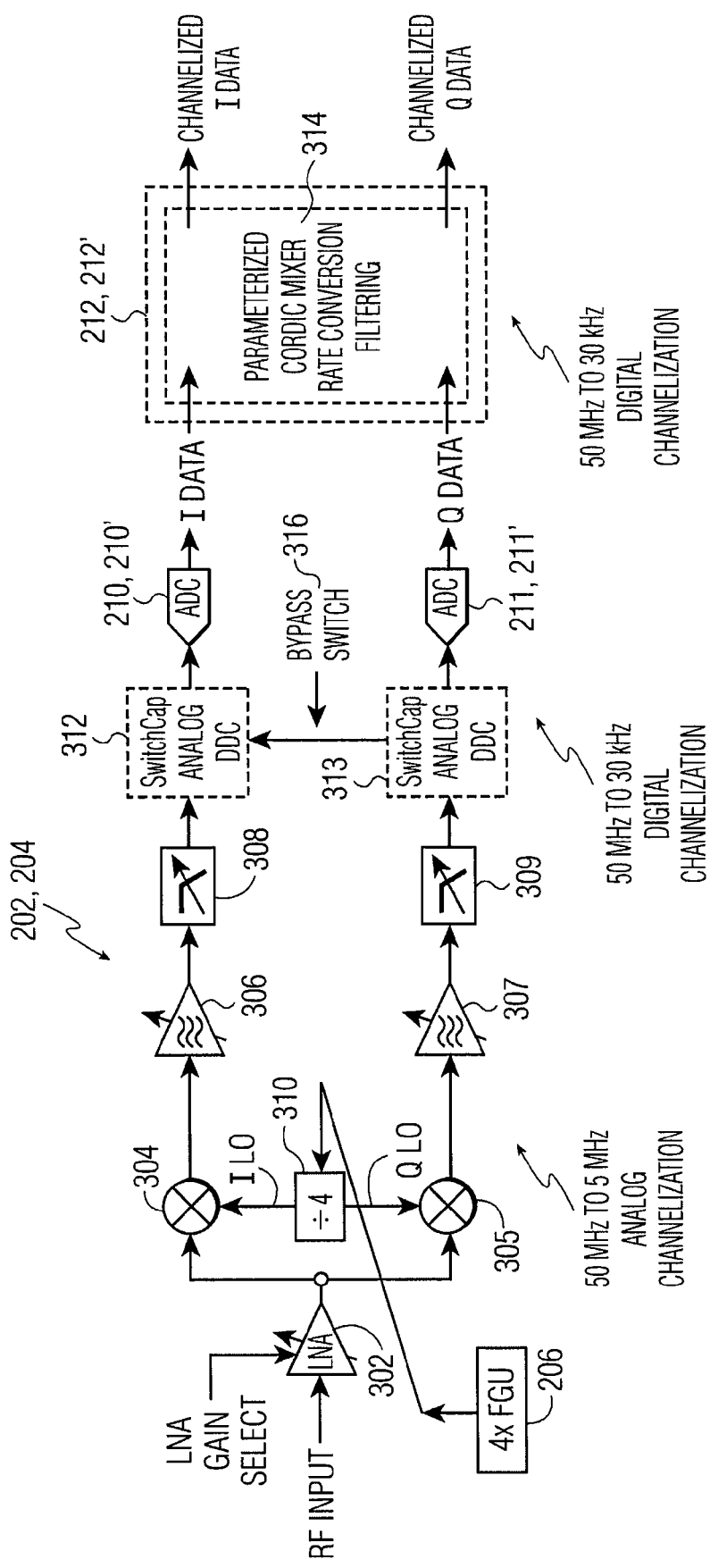
FIGS. 3A-3D are block diagrams of a channel of the receiver module shown in FIG. 2, illustrating options of analog and/or digital channelization in accordance with embodiments of the present invention.

Referring next to FIG. 3A, there is shown a block diagram of a channel of receiver module 200 (FIG. 2), including L(R)-RCVR module 202 (204), ADC 210 (210'), 211 (211') and DSP 212 (212'). An RF signal, such as RF signal 221 (223) is provided to L(R)-RCVR module 202 (204), which down converts the RF signal to baseband I and Q signals and, optionally, performs analog channelization or analog domain (AD) digital channelization.

The RF signal is provided to low noise amplifier (LNA) 302 which amplifies the RF signal according to a selectable gain. The amplified signal is mixed using mixers 304 and 305 with respective quadrature signals, I local oscillator (LO), Q LO, at the carrier frequency. The mixers 304,305 down-convert the RF signal to baseband I and Q signals.

In an exemplary embodiment, the I LO and Q LO signals are produced by FGU 206 divided by divisor 310, where 4×FGU represents a four-times (4×) frequency multiplication. The FGU maintains a 90° phase difference between the I LO and Q LO signals. In another embodiment, a two-times (2×) frequency multiplication may be used with a divisor 310 of two. It is understood that a 2× frequency multiplication may be used, provided that the duty cycle of the clock is substantially precise such that unwanted phasors are not introduced into the I LO and Q LO.

Following the down-conversion, variable gain amplifiers 306,307 amplify the down-converted I and Q signals. Then, I channel tunable low pass filter 308 and Q channel tunable low pass filter 309 remove undesired mixing terms, bandlimit the signal so that Nyquist sampling criteria may be met, and perform any analog channelization. The analog digital down converter (DDC) 312,313 provide programmable discrete time continuous amplitude (analog domain) digital down conversion using switched capacitor circuits, referred to herein as AD digital channelization. DDC 312,313 can be controlled with bypass command signal 316 to provide no DDC processing, effectuating a bypass function. The baseband I and Q signals, optionally with analog channelization or AD digital channelization, are then digitized (into a 12 or 14 bit signal, for example) by the I and Q ADCs 210 (210'), 211 (211') to form I and Q data, i.e. digitized I and Q signals. The I and Q data may optionally be provided to COordinate Rotation DIgital Computer (CORDIC) mixer 314 of DSP 212 (212') for digital domain (DD) digital channelization, described further below.

In general, channelization extracts a sub-band signal from the baseband I and Q signals. For example, a 40 MHz signal centered on a 2.4 GHz carrier may be down converted to 75 MHz baseband I and Q signals by L(R)-RCVR 202 (204). Channelization, performed either within L(R)-RCVR 202 (204) or within CORDIC mixer 314, may then extract a 20 MHz sub-band signal from the baseband signal for further processing.

Each receiver module 200 can tune within a wideband RF spectrum spanning from 1 to 10 octaves, beginning (approximately) from 20 MHz and ending (approximately) at 20 GHz. In an exemplary embodiment, 8 octaves are spanned from 20 MHz to 5 GHz with 200 MHz of aliased quadrature sampled bandwidth in I and in Q, which when subtracted in complex arithmetic yields 100 MHz of unaliased bandwidth.

Channelization may be performed in the analog domain or in the digital domain. In the digital domain, mathematical operations for channelization are performed in a full numeric domain on the digitized I and Q signals. In the analog domain, analog channelization on the analog baseband I and Q signals may be performed in two ways: (1) by analog filters such as by I and Q tunable filters 308,309 and (2) by discrete time programmable switched capacitor (switchcap) circuits DDC 312,313. Switchcap discrete time analog DDCs 312,313 include capacitors (not shown) and transistor circuits (not shown) for storing charge and redistributing charge so as to perform discrete time operations which are mathematically equivalent to pure numeric digital functions on the stored charge in the analog domain. Accordingly, switchcap analog DDCs 312,313 perform digital channelization entirely in the analog domain.

In an exemplary embodiment, analog channelization provides between 50 MHz to 5 MHz band channelization (approximately), whereas AD digital channelization (by switchcap analog DDCs 312,313) and DD digital channelization (by CORDIC mixer 314) provides between 50 MHz to 30 kHz band channelization (approximately). It is understood that the bandwidths for channelization shown in FIG. 3A are exemplary and that any suitable bandwidth for the channelization sub-band may be used.

Analog channelization typically uses less power but has reduced accuracy as compared with AD and DD digital channelization. In addition, DD digital channelization provides better accuracy than AD digital channelization and analog channelization but at the expense of using the most power. It may be appreciated that receiver module 200 provides flexibility in selecting channelization methods according to power usage versus required accuracy.

The paragraphs that follow discuss various configurations of the present invention to select out of the RF spectrum the final baseband. Where the signal characteristics and accuracy requirements permit analog channelization, the present invention may be configured to use only analog channelization to save on system power. Where the signal characteristics and accuracy requirements do not permit full analog channelization, the present invention may be configured to reduce the digital channelization workload as much as possible. This may be accomplished by using the analog channelization method with a programmable accuracy guard band to partially channelize the signal, which greatly reduces the workload required to complete the final channelization using the digital channelization method.

Figure 3B:
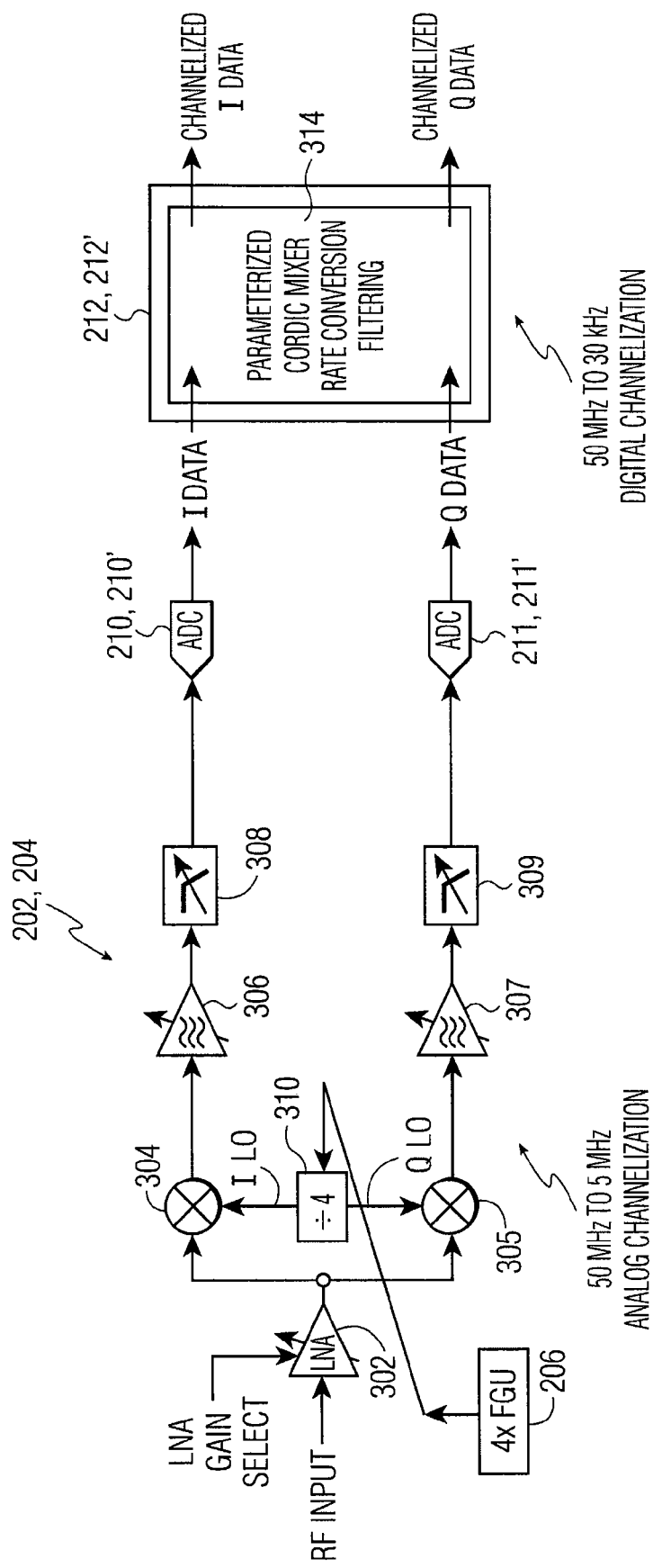

For example, FIG. 3B illustrates a configuration of a channel of receiver module 200 that includes both analog and digital channelization. The goal of this configuration is to use the power saving analog channelization technique to reduce the total system power used by the digital channelization. In this example, the work is shared between the two methods, with analog channelization used to narrow the bandwidth of the input signal. The required sample rate of ADCs 210 (210') and 211 (211') and also the amount of numeric processing effort used in DSP 212 (212') are, thus, lowered. In particular, analog channelization is performed by I and Q tunable filters 308,309 of L/R-RCVR 202 (204). Bypass control signal 316 is set to command switchcap analog DDCs 312,313 (FIG. 3A) to perform no DDC operation, hence effectuating a bypass function such that the analog channelized I and Q data are directly digitized by ADCs 210 and 211 and presented numerically to CORDIC mixer (and sample rate converter and digital filter block) 314 of DSP 212 (212') for DD digital channelization.

CORDIC mixer 314, generally acts on the discrete-time digitized signal for final frequency conversion to baseband, sample rate conversion for reduced computational load, and frequency filtering for channel selection. CORDIC mixer 314 acts in the numeric domain using a CORDIC algorithm to effectively translate the frequency of the incoming digitized signal (in both I and Q) for both up-conversion and down-conversion of the signal.

The CORDIC algorithm reduces the number of computational multiplications that are used to perform signal mixing for frequency conversion by implementing an iterative algorithm that uses additions, subtractions and register storage. CORDIC mixer 314 is used to make adjustments to signal frequency as the final conversion to baseband, to compensate for low-IF frequency offset, frequency generation unit (FGU 206) frequency step size, signal Doppler, and other tuning inaccuracies.

The channel rate conversion function of block 314 uses a process of digital decimation to reduce the rate of data flow through the processing system and to reduce the computational demands on the digital processing unit. The frequency filtering function of block 314 selects the channel or channels of interest for further processing. Adjacent signals that are not of interest and are outside of the filter bandwidth are rejected. The direct approach uses a digital filter to form the selective channel. A multi-rate filter cascades a series of progressively narrower bandwidth filters, each followed by a sample-rate conversion stage, to reduce a data rate and computational load for the digital processor.

In the configuration shown in FIG. 3B, CORDIC mixer 314 performs the final channelization. The digital signals CORDIC mixer 314 receives were first partially channelized from the I and Q tunable filters 308 and 309 and then digitized by ADCs 210 (210') and 211 (211'). CORDIC mixer 314 takes these partially channelized signals and completes the channelization in the numeric domain. For example, using the direct conversion architecture of mixers 305 (305'), 304 (304') and I and Q tunable filters 309 (309'), and 308 (308'), a 2 MHz wide baseband signal received with a carrier frequency of 2.4 GHz is partially channelized to a 5 MHz band with an offset of 1 MHz. ADCs 210 (210') and 211 (211') digitize this 5 MHz band and presents the numeric data to CORDIC mixer 314. CORDIC mixer 314 then numerically downconverts the 5 MHz band using the CORDIC algorithm by 1 MHz, shifting the channel frequency 1 MHz and digitally filters the resultant band to a 2 MHz channel, thus obtaining the original baseband signal.

Figure 3C:
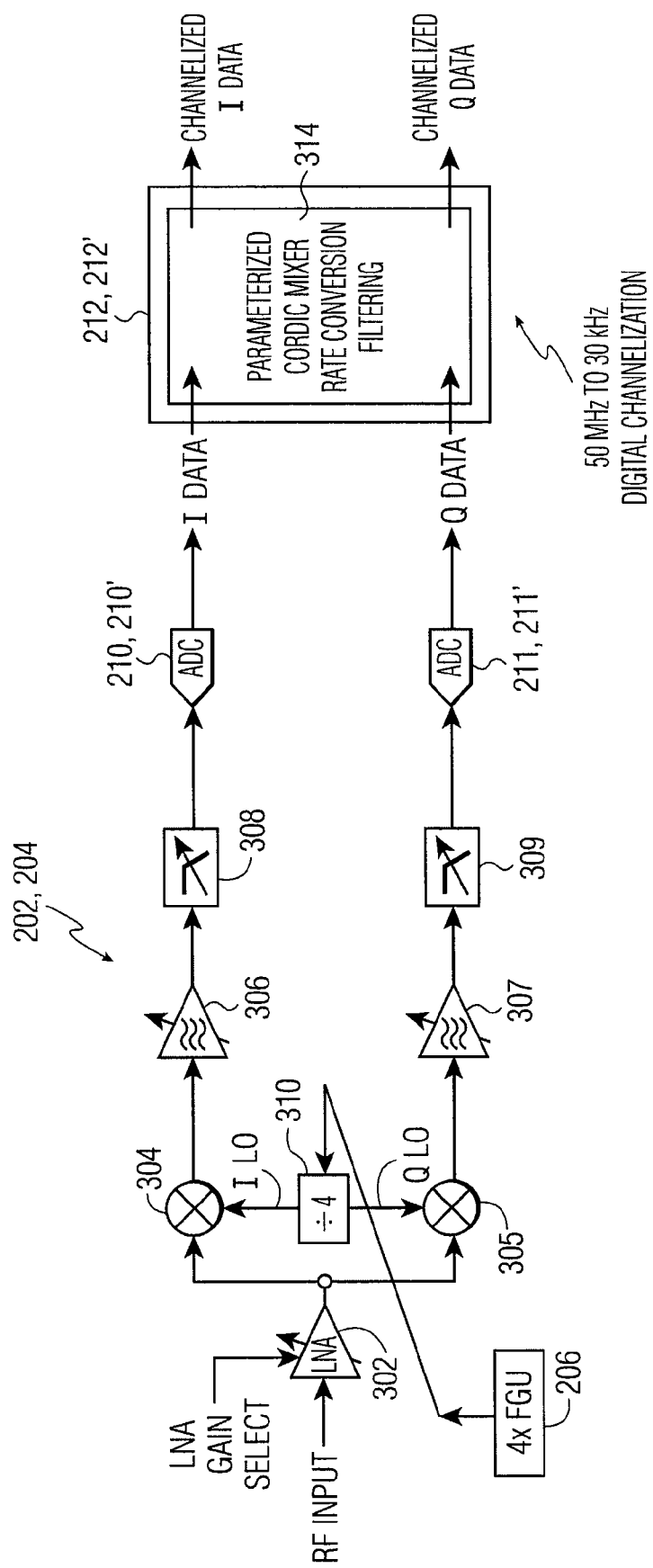

FIG. 3C illustrates a configuration where channelization is performed in the digital domain. In this example, variable gain amplifiers 306,307 and I and Q channel tunable filters 308,309 are set such that they bandlimit the signals received from mixers 304, 305 to the maximum frequency bandwidth of the scalable radio receiver (202 and 204), as determined by the maximum sampling rate of ADCs 210 and 211. By the Nyquist criteria, filters 308 and 309 are set to values less than twice the maximum sampling rate of ADC's 210 and 211. Bypass control signal 316 is set to command switchcap analog DDCs 312,313 (FIG. 3A) to perform no DDC operation, effectuating a bypass function. Thus, the unadjusted baseband I and Q signals are digitized by ADC's 210 and 211, with the raw numeric information presented to the CORDIC mixer, sample rate conversion, and digital filter block 314. CORDIC mixer 314 performs digital filtering and DD digital channelization as before in the previous example. This case provides the greatest numeric control and potential accuracy at the expense of additional power to numerically process the widest possible bandwidth that scalable radio receiver (202 and 204) can receive.

Figure 3D:
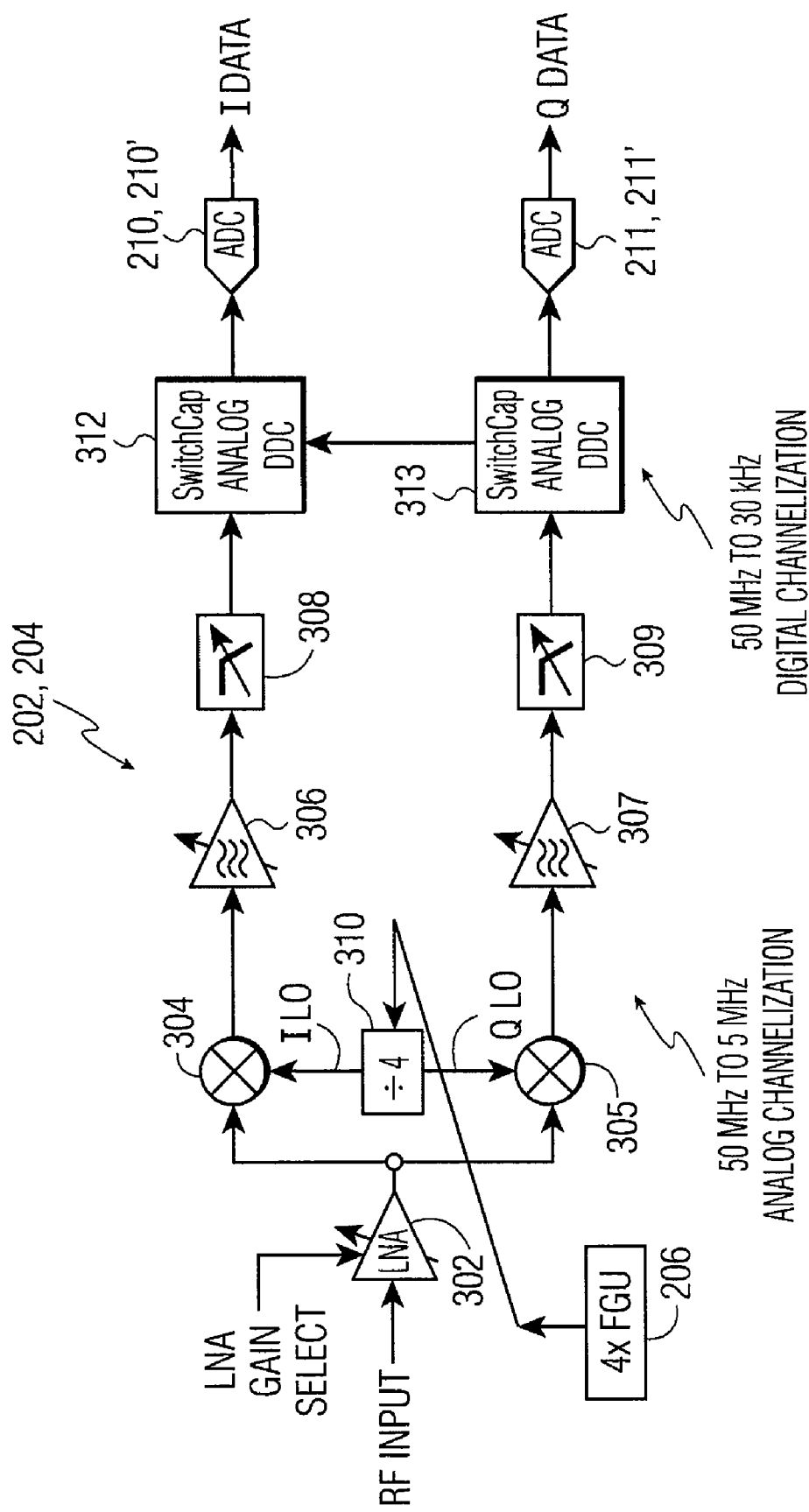

FIG. 3D illustrates a configuration where both analog channelization and AD digital channelization are performed by L/R-RCVR 202 (204). Analog channelization is performed by I and Q tunable filters 308,309. The bypass switch 316 is set to select switchcap analog DDCs 312,313 such that AD digital channelization is performed. The digitally channelized and digitized I and Q data are then transmitted from ADC 210 (210'), 211 (211'), for example, to processor module 106 (FIG. 2).

It may be appreciated from FIGS. 3A-3D that receiver module 200 provides a selectable IF signal directly from RF system module 102 and three methods for channelizing the baseband I and Q signals. In particular, receiver module 200 provides flexibility of analog and full DD digital channelization, full DD digital channelization and full AD digital channelization.

It may be appreciated that each scalable receiver system 100 may be configured to provide different sub-bands of the RF spectrum for further processing by other modules, such as demodulator 218 (FIG. 2). Accordingly, multiple scalable receiver systems 100 may be configured into an integrated system (i.e. using two or more scalable receiver systems 100).

Each digital data stream (representing different sub-bands) from corresponding scalable receiver systems 100 in the multiple receiver system may be transmitted substantially simultaneously for further processing using high speed serializing input/output (I/O) blocks 216 (216'), such as for time difference of arrival (TDOA) processing, left and right RF wavefront circular polarization processing and/or frequency monitoring.

Digital control of the scalable radio to adjust all of its parameters, including the various methods of channelization and the large amounts of data the scalable radio receiver can generate, are accommodated by high speed I/O block 216 (216'). The parallel data supplied by block 214 (214') is converted into serial data and transmitted by electrical means to an aggregating harness of electrical wires. The high speed I/O block may use any of a number of standard electrical wire signaling methods, including binary phase shift keying (BPSK) encoding and low voltage differential signaling (LVDS) to provide a reduced pin count of 4 wires for each scalable receiver output (216 and 216').

The scalability of receiver system 100 (FIG. 1) will now be described with respect to FIGS. 4A-4C. In general, a plurality of receiver systems 100 may be configured in a horizontal plane or may be vertically stacked, one on top of the other (or any combination thereof).

Referring to FIG. 4A, there is shown an arrangement of 16 scalable receiver systems 100 in a horizontal plane to form a 16× receiver system, designated generally as 402. Sixteen RF system modules 102 are formed on Si carrier 404 and sixteen processor modules 106 corresponding to respective RF system modules 102 are formed between Si carrier 404 and mechanical carrier 406. Si carrier 404 and mechanical carrier 406 are similar to Si carrier 104 and mechanical carrier 106 (except that Si carrier 404 and mechanical carrier 406 may be a single unit, large enough to support sixteen RF system modules 102 and sixteen processor modules 106). It is understood that, depending upon the processing requirements of 16× receiver system 402, processor modules 106 may be replaced by slots 106' (not shown in FIG. 4A). Receiver system 402 is configured to receive RF signals from dual antennas (not shown) and provide data streams from each of the sixteen receivers 200 (FIG. 2). In this example configuration, the 16× receivers each connect to host system 218 (the system that receives the scalable radio signals) using 4 dedicated electrical lines from each of the 16 receivers, for a total of 64 lines. Power and ground connections may be supplied by the 16× receiver (402) substrate.

Referring to FIG. 4B, there is shown an arrangement of four 16× receiver systems 402 to form a 64× receiver system, designated generally as 410. Each of receiver systems 402 are arranged in a horizontal plane. In this arrangement, each 16× receiver module (402) provides 64 signal lines to the 64× receiver (410) substrate for a total of 256 electrical lines. Power and ground connections may be supplied by the 64× receiver (410) substrate.

Referring next to FIG. 4C, a plurality of 64× receiver systems 410 may be vertically stacked, one on top of the other, to form receiver system 420. In this arrangement, each 64× receiver (410) module supplies its 256 signal lines to an aggregating network system assembly, using 10 Gigabit Ethernet (10 GigE), that is paired with each 64× receiver module. Mechanically, receiver system 420 consists of alternating planes of 64× receiver 410 and the aggregating 10 GigE network assembly 414. In this high receiver count configuration, the aggregating 10 GigE network assembly is used to connect to the final host system 218 (FIG. 2). It is understood that FIGS. 4A-4C are examples of the scalability of RF systems 100 and that any other suitable horizontal or vertically stacked number and arrangement of scalable RF systems 100 may be used.

Referring next to FIG. 5, there is shown a block diagram of 64× receiver system 410 (FIG. 4B) that includes four 16× receiver systems 402, each having sixteen RF system modules 102. Antenna system 502 includes antennas 220, 222 having respective LNAs 506, 508. The LNAs 506, 508 amplify respective RF signals 221,223 from antennas 220, 222 and provide amplified RF signals to receiver system 410. Four way splitters 510 are configured to distribute the amplified RF signals from antenna system 502 to each 16× receiver system 402 and to each RF system module 102. Dual lines from four-way splitter 510 illustrate differential signals.

Figure 6A:
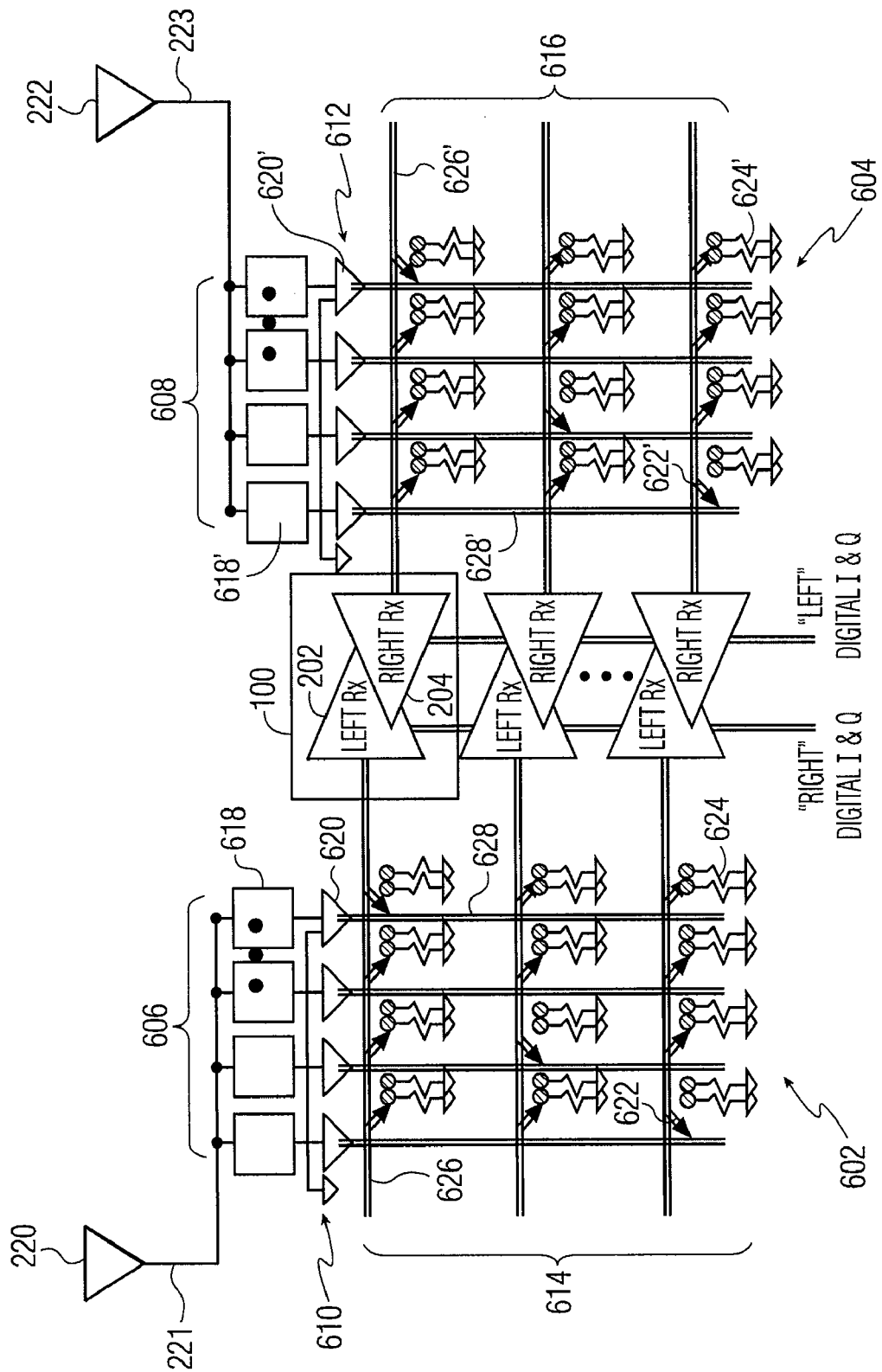
FIG. 6A is a block diagram of a filterbank matrix for filtering and distributing RF signals to scalable receiver systems, in accordance with an embodiment of the present invention.
Figure 6B:
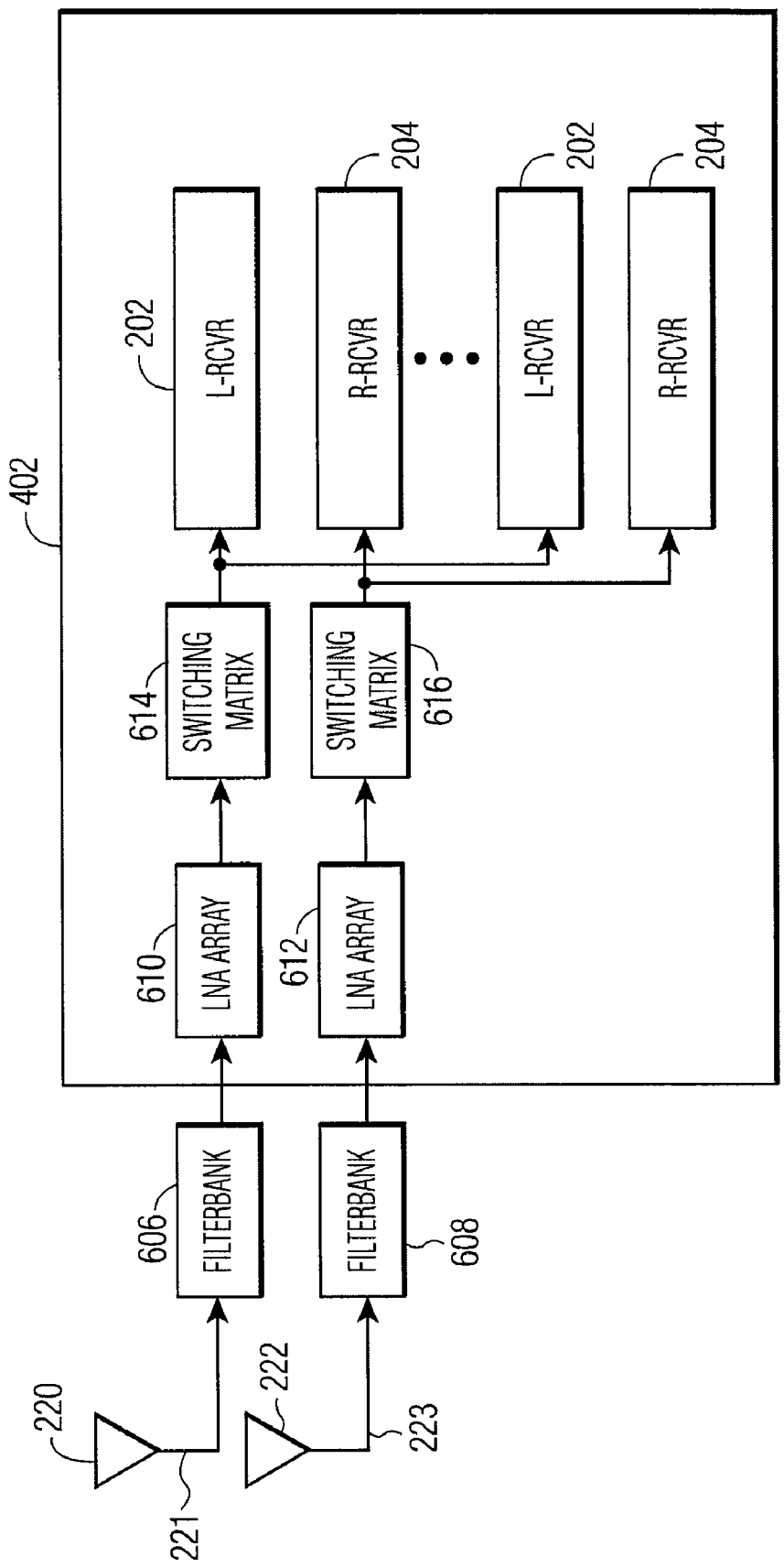
FIG. 6B is a block diagram illustrating placement of the filterbank matrix shown in FIG. 6A as part of the scalable receiver system shown in FIG. 2, in accordance with an embodiment of the present invention.
Figure 7:
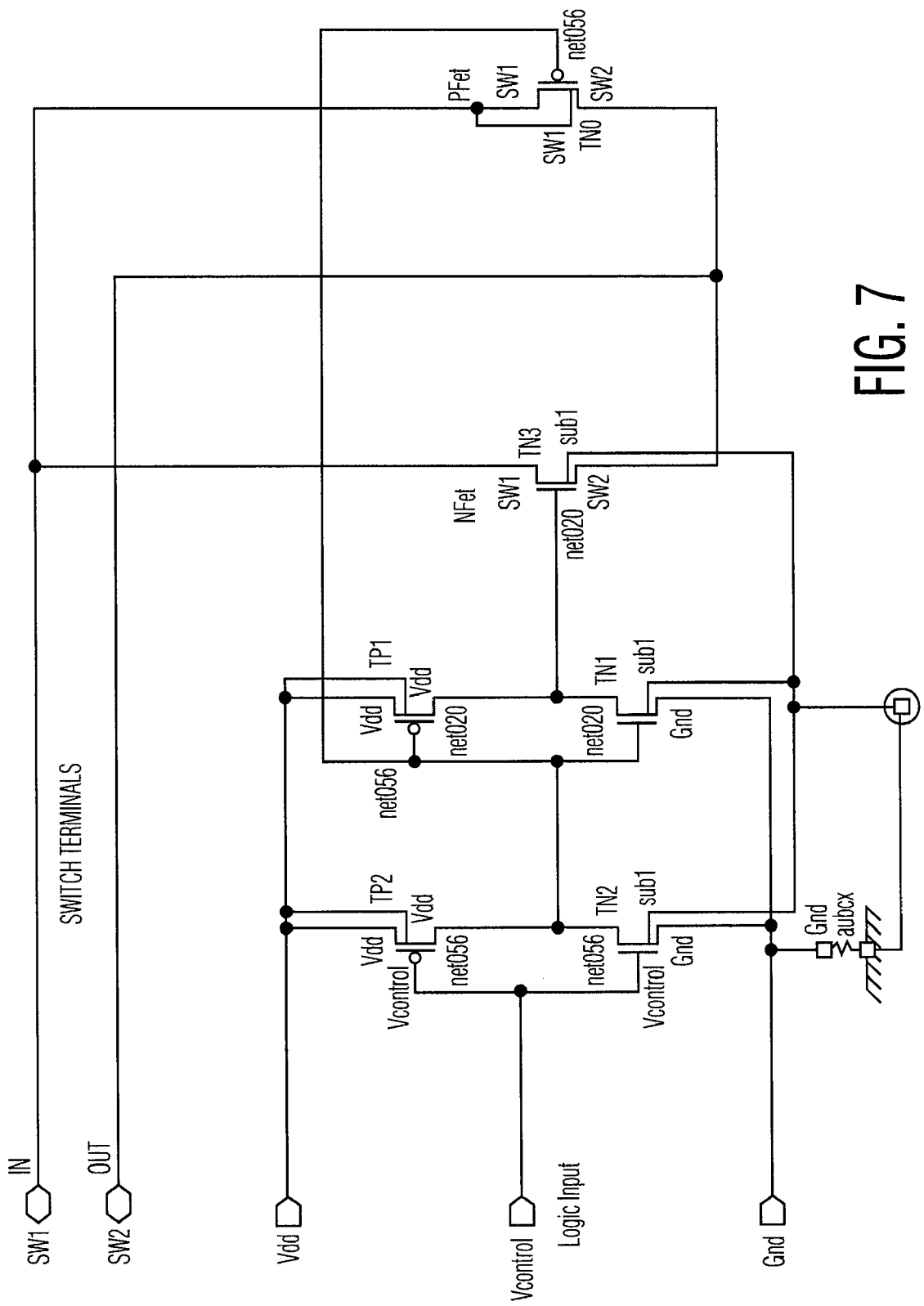
FIG. 7 is a circuit diagram of a complementary metal-oxide semiconductor (CMOS) switch used in the switching matrices shown in FIG. 6A, in accordance with an embodiment of the present invention.

Referring next to FIGS. 6A, 6B and 7, preselect filterbank matrices 602, 604 are illustrated for selectively filtering and distributing RF signals 221, 223 from antennas 220, 222 to a plurality of scalable receiver systems 100. Each filterbank matrix 602, 604 includes respective filterbanks 606,608, LNA arrays 610,612 and switching matrices 614,616.

Referring to the left side of FIG. 6A, RF signal 221 from left antenna 220 is provided to each of N filters 618 (where N is a positive integer) of filterbank 606. Each filter 618 simultaneously filters RF signal 221 and provides a respective filtered signal to a respective LNA 620 of LNA array 610. The amplified signals are then provided to switching matrix 614. It is understood that similar processing occurs with RF signal 223 of right antenna 222 via filterbank 608, LNA array 612 and switching matrix 616.

Continuing with the left side of FIG. 6A, switching matrix 614 provides a connection of the amplified and filtered signals from LNA array 610 to a plurality of receiver systems 100. In particular, switches 622 either connect column lines 628 to L-RCVRs 202 (i.e. left Rx) via respective row lines 626 or terminate column lines 628 to ground via resistors 624. In FIG. 6A, row lines 626 and column lines 628 are illustrated as double lines to represent differential signals.

FIG. 7 is a circuit diagram illustrating an exemplary CMOS switch 622,622' used in switching matrices 614,616. It is understood that similar signal distribution occurs with the amplified and filtered signals from LNA array 612 to a plurality of R-RCVRs 204 (i.e. right Rx) via switching matrix 616.

As shown in FIG. 6A, the first row is connected to the fourth filter, the second row is connected to the second filter, and the third row is connected to the first filter.

In an exemplary embodiment, each LNA 620 (620') of LNA array 610 (612) is powered on. One filter 618 (618') of column lines 628 (628') is connected to row line 626 (626') and the remaining filters 618 (618') are terminated to ground so that one filter 618 (618') is selected at any given time for a row 626 (626'). In this embodiment, the impedance seen by the left channel receivers, left Rx 202, is the same as the impedance seen by the right channel receivers, right Rx 204. It is understood that any suitable filter selection may be used such that the impedance into the left and right channel receivers 202, 206 is controlled. It is understood that resistors 624, 624' may be, for example, 50 ohms.

In an exemplary embodiment, filterbanks 606, 608 include 4-8 filters where filters 618, 618' are notch filters. It is understood that an arbitrary arrangement and number of filters 618, 618' may be provided to service rows 626,626' and that any suitable type of filter may be used for preselect filterbank matrices 602,604.

FIG. 6A illustrates preselect filterbank matrices 602 and 604 as separate from scalable receiver systems 100. Portions of preselect filterbank matrices 602 and 604 may also be formed within scalable receiver systems 100, for example as part of multiple receiver system 402 (FIG. 4A). FIG. 6B illustrates placement of portions of the preselect filterbank matrices 602 and 604 within multiple scalable receiver systems 100. In an exemplary embodiment, filterbanks 606, 608 are formed external to multiple receiver system 400. LNA arrays 610, 612 and switching matrices 614, 616 are formed within multiple receiver system 402, for example, for distribution to a number of L/R-RCVRs 202, 204.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A scalable system on an integrated circuit (SoC) comprising:
   a first radio frequency (RF) system disposed on a first substrate;
   a second RF system disposed on a second substrate;
   a first processor, configured to process the first RF system, disposed on a substrate separate from the first substrate; and
   a second processor, configured to process the second RF system, disposed on a substrate separate from the second substrate,
   wherein the first processor and the first RF system are stacked one on top of the other to configure a first RF system on the integrated circuit (RFSoC),
   the second processor and the second RF system are stacked one on top of the other to configure a second RFSoC, and
   the first RFSoC and the second RFSoC are disposed either (a) in a horizontal plane, laterally spaced from each other, or (b) in vertically stacked planes, one above the other.

2. The scalable SoC of claim 1, wherein
   the first and second substrates are each a silicon carrier,
   the substrates separate from the first and second substrates are each a mechanical carrier, and
   each silicon carrier is stacked on top of each mechanical carrier.

3. The scalable SoC of claim 1, further comprising:
   a first plurality of RFSoCs, each RFSoC configured similarly to either the first RFSoC or the second RFSoC,
   wherein the first plurality of RFSoCs are disposed either (a) in the horizontal plane or (b) in the vertically stacked planes.

4. The scalable SoC of claim 3, wherein
   the first plurality of RFSoCs and the first and second RFSoCs are disposed in a first horizontal plane to form a first layer of laterally spaced RFSoCs.

5. The scalable SoC of claim 4, wherein
   a second plurality of RFSoCs are disposed in a second horizontal plane to form a second layer of laterally spaced RFSoCs, and
   the first layer is stacked on top of the second layer.

6. The scalable SoC of claim 1, wherein
   each of the first and second RF systems includes a left receiver and a right receiver,
   the left receiver is coupled to a left antenna and the right receiver is coupled to a right antenna, and
   each of the left and right receivers includes in-phase (I) and quadrature (Q) channels.

7. The scalable SoC of claim 6, wherein
   each of the I and Q channels includes an analog-to-digital converter (ADC) for providing a digital signal to the first and second processors.

8. The scalable SoC of claim 6, wherein
   the left antenna provides a first RF signal to the left receiver and the right antenna provides a second RF signal to the right receiver, and
   each of left receiver and the right receiver down-converts the respective first RF signal and the second RF signal to a baseband signal, and
   the baseband signal includes an I baseband signal and a Q baseband signal that are provided to the respective I and Q channels.

9. The scalable SoC of claim 8, wherein
   each of the left receiver and the right receiver is configured to perform an analog channelization or an analog domain (AD) digital channelization of the respective baseband signal for providing a channelized signal or the baseband signal to the first or second processors, and
   each of the left processor and the right processor is configured to perform a digital domain (DD) digital channelization on the channelized signal or the baseband signal received from the left or right receiver.

10. The SoC of claim 9, further comprising
    a controller configured to control the left and right receivers and the left and right processors to perform the analog channelization, the AD digital channelization and/or the DD digital channelization.

11. The SoC of claim 9, wherein
    each of the left receiver and the right receiver includes a tunable filter for providing an analog channelized signal to the left or right processor.

12. The SoC of claim 9, wherein
    each of the left receiver and the right receiver includes a switched capacitor (switchcap) analog digital down converter (DDC) to provide an AD digital channelized signal to the left or right processor.

13. The scalable SoC of claim 8, further comprising:
    a first filterbank matrix coupled between the left antenna and each of the left receiver to filter the first RF signal and distribute the first filtered RF signal to the first RF system, and
    a second filterbank matrix coupled between the right antenna and the right receiver to filter the second RF signal and distribute the second filtered RF signal to the second RF system.

14. The scalable SoC of claim 13, wherein each of the first filterbank matrix and the second filterbank matrix includes:
    a low noise amplifier (LNA) array including a number of LNAs, each LNA configured to amplify the first RF signal or the second RF signal from the respective left antenna or the right antenna;
    a filterbank coupled to the LNA array including a number of filters, each filter configured to filter the amplified RF signal received from the corresponding LNA; and
    a switching matrix coupled between the filterbank and each of the first and second RF systems, the switching matrix configured to selectively distribute the filtered RF signals to the first and second RF systems.

15. The scalable SoC of claim 14, wherein
    the LNA array and the switching matrix are formed internal to the first or second RFSoC and the filterbank is formed external to the first or second RFSoC.

16. The scalable SoC of claim 7, wherein
    each of the first and second processors includes left and right processors, and the left processor is coupled to the left receiver and the right processor is coupled to the right receiver.

17. The scalable SoC of claim 16, wherein each of the left and right processors includes an input/output (I/O) port for providing a digital data stream from the left or right processor.

18. The scalable SoC of claim 16, wherein
each of the first processor and the second processor includes:
a digital signal processor (DSP) configured to perform a digital domain channelization on the digital signal received from the I or Q channels, to form a digital channelized signal; and
a multiplexer configured to select one of the digital channelized signal and the digital signal.

19. The scalable SoC of claim 18, wherein the DSP includes a COordinate Rotation DIgital Computer (CORDIC) mixer.

20. A method of forming a scalable system on an integrated circuit (SoC), the method comprising:
forming a first radio frequency (RF) system on a first substrate;
forming a second RF system on a second substrate;
forming a first processor, configured to process the first RF system, on a substrate separate from the first substrate;
forming a second processor, configured to process the second RF system, on a substrate separate from the second substrate;
stacking the first processor and the first RF system one on top of the other to configure a first RF system on the integrated circuit (RFSoC);
stacking the second processor and the second RF system one on top of the other to configure a second RFSoC; and
disposing the first RFSoC and the second RFSoC either (a) in a horizontal plane, laterally spaced from each other, or (b) in vertically stacked planes, one above the other.

21. The method of claim 20, further including:
forming a first plurality of RFSoCs, each RFSoC configured similarly to either the first RFSoC or the second RFSoC; and
disposing the first plurality of RFSoCs either (a) in the horizontal plane or (b) in the vertically stacked planes.

22. The method of claim 21, wherein
the first plurality of RFSoCs and the first and second RFSoCs are disposed in a first horizontal plane to form a first layer of laterally spaced RFSoCs.

23. The method of claim 22, further comprising
disposing a second plurality of RFSoCs in a second horizontal plane to form a second layer of laterally spaced RFSoCs; and
stacking the first layer on top of the second layer.

* * * * *